United States Patent [19]

Seidel et al.

[11] Patent Number: 5,067,232
[45] Date of Patent: Nov. 26, 1991

[54] METHOD FOR CONTACTING SHIELDING PLATES

[75] Inventors: Peter Seidel, Groebenzell; Karl Zell, Niederpoecking, both of Fed. Rep. of Germany

[73] Assignee: Siemens Aktiengesellschaft, Munich, Fed. Rep. of Germany

[21] Appl. No.: 697,004

[22] Filed: May 8, 1991

[30] Foreign Application Priority Data

May 16, 1990 [EP] European Pat. Off. ........ 90109254.4

[51] Int. Cl.$^5$ .............................................. H05K 3/30
[52] U.S. Cl. ...................................... 29/837; 439/607; 174/35 R; 361/424
[58] Field of Search ................................ 29/837–839; 439/607; 174/35 R; 361/424

[56] References Cited

U.S. PATENT DOCUMENTS 4,754,101  6/1988  Stickney et al. ................. 174/35 R

FOREIGN PATENT DOCUMENTS 312899  12/1989  Japan ........................ 174/35 R Primary Examiner—P. W. Echols
Attorney, Agent, or Firm—Hill, Van Santen, Steadman & Simpson

[57] ABSTRACT

A method for contacting shielding plates having press-in pins and attached to an upper side of a printed circuit board to further shielding plates also having press-in pins and located on a lower side of the printed circuit board. The upper shielding plate with press-in pins having arcuate press-in zones is placed free of force into respective through-contacted printed circuit board holes and is contacted against walls of the holes by pressing into the same holes press-in pins having V-shaped press-in zones of the lower shielding plate in order to achieve a gas-tight, good contacting, i.e. a shielding diverter.

3 Claims, 2 Drawing Sheets

METHOD FOR CONTACTING SHIELDING PLATES

BACKGROUND OF THE INVENTION

The present invention is directed to a method for contacting shielding plates having press-in pins and attached to an upper side of a printed circuit board to further shielding plates also having press-in pins and attached to a lower side of the printed circuit board.

In the prior art the requirement for high-frequency shielding of plugs or assemblies on printed circuit boards was generally not particularly high. It is adequate in most instances to contact the shielding plates on the assembly printed circuit board at a relatively large distance. Recesses in the shielding plates due to the mutually alternating press-in pins thereby also had to be accepted. Such contactings of the shielding plates are no longer adequate for applications in which data transmissions have data transmission rates above 100 Mbit/s.

SUMMARY OF THE INVENTION

It is an object of the present invention to provide a method which enables a shielding of plugs or assemblies on printed circuit boards in a simple manner and that also enables a substantially error free transmission for high data transmission rates.

For such a method, this object is inventively achieved in that the press-in pins of the upper shielding plates have arcuate press-in zones, whereas the press-in pins of the lower shielding plates have V-shaped press-in zones, whereby apexes of the two curved press-in zones always lie at the same side. The upper shielding plate has its press-in pins inserted free of any force into the holes of the printed circuit board to be through-contacted and a firm contacting between the respective press-in pins and the printed circuit board is subsequently produced by pressing the V-shaped press-in pins of the lower shielding plate into the already occupied holes of the printed circuit board.

An optimum shielding is achieved in the method of the present invention on the basis of the reduction of necessary division spacing as well as on the basis of the omission of any recesses. This is achieved by pressing the respective individual press-in pins of the upper and lower shielding plates into only one through-contacted hole of the printed circuit board. A gas-tight contacting that is good on all sides, i.e. a shielded diverter, is achieved by the method of the present invention.

BRIEF DESCRIPTION OF THE DRAWINGS

The features of the present invention which are believed to be novel, are set forth with particularity in the appended claims. The invention, together with further objects and advantages, may best be understood by reference to the following description taken in conjunction with the accompanying drawings, in the several Figures in which like reference numerals identify like elements, and in which:

DESCRIPTION OF THE PREFERRED EMBODIMENT

Figure 1:
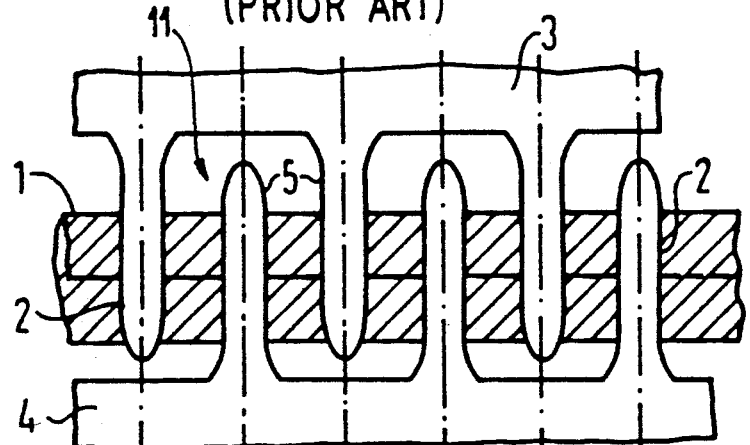
FIG. 1 depicts the contacting of an upper shielding plate and a lower shielding plate to the printed circuit board in the prior art.

FIG. 1 shows a prior art contacting of upper and lower shielding plates to a printed circuit board 1. The press-in pins 5 of the upper shielding plate 3 as well as of the shielding plate 4 are alternately pressed into printed circuit board holes 2 of the printed circuit board 1. Recesses 11 in the shielding plates due to this mutually alternating press-in also has to be provided, as may be seen from FIG. 1.

Figure 2:
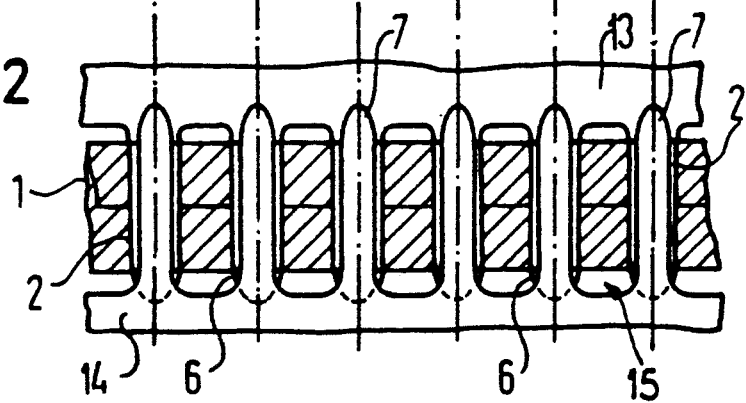
FIG. 2 depicts the contacting of an upper shielding plate and a lower shielding plate both to one another as well as to the printed circuit board in accordance with the present invention.

FIG. 2 shows a contacting of an upper shielding plate 13 to a lower shielding plate 14 according to the present invention given the same division spacing t of the pins of the upper and lower shielding plates of the prior art configuration and of the configuration of the present invention. The improvement of the shielding can even be seen in purely optical terms when comparing the two figures.

In the method of the present invention, the press-in pins of both the upper shielding plate 13 and the lower shielding plate 14 are respectively introduced into the same printed circuit board hole 2. It clearly follows from FIG. 2 that the space 15 that is necessarily not shielded due to the design has been significantly reduced in size in comparison to the space 11 of the prior art method.

Figure 3:
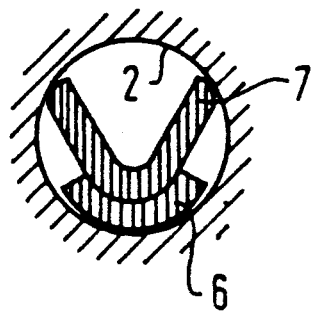
FIG. 3 is a cross-sectional view through a through-contacted printed circuit board hole according to the method of the present invention.

In order to achieve a good contacting, the press-in pins of one shielding plate, for example, the upper shielding plate, have arcuate press-in zones, whereas the press-in pins of the other shielding plate, for example, the lower shielding plate have V-shaped press-in zones. The shielding plate 13 having the arcuate press-in zones first has its press-in pins 6 placed into the printed circuit board holes 2 free of any force. Subsequently, the V-shaped press-in pins 7 of the lower shielding plate 14 are pressed into the printed circuit board holes 2 from the other side while exerting force. The contacting then achieved is illustrated in FIG. 3.

Figure 4:
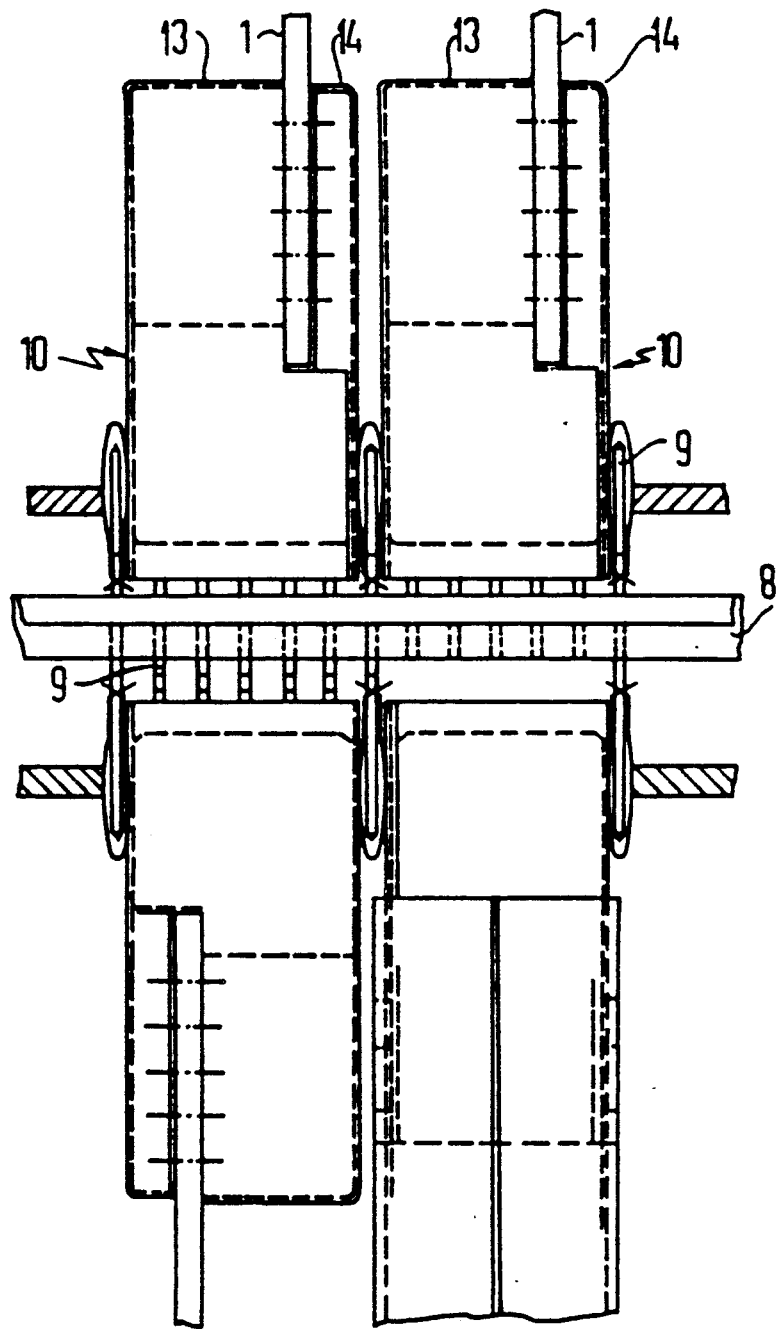
FIG. 4 depicts an applied example of the method of the present invention.

FIG. 4 shows an applied example of the method of the present invention. Only the component parts necessary for an understanding of the method of the present invention are referenced. A back plane wiring 8 having perpendicularly extending contact blades 9 is depicted in FIG. 4. A plurality of plugs 10 that are connected to respective printed circuit boards 1 are plugged onto the contact blades 9 of the back plane wiring 8. These plugs 10 are each respectively shielded by upper shielding plates 13 and lower shielding plates 14. The method of the present invention involves the contacting of the lower and upper shielding plates 14, 13 to the printed circuit board 1.

The invention is no limited to the particular details of the method depicted and other modifications and applications are contemplated. Certain other changes may be made in the above described method without departing from the true spirit and scope of the invention herein involved. It is intended, therefore, that the subject matter in the above depiction shall be interpreted as illustrative and not in a limiting sense.

What is claimed is:

1. A method for contacting upper shielding plates having press-in pins and located on an upper side of a printed circuit board to lower shielding plates having press-in pins and located on a lower side of the printed circuit board, comprising the steps of: providing arcuate press-in zones for the press-in pins of the upper shielding plates and providing V-shaped press-in zones for the press-in pins of the lower shielding plates, apexes of the arcurate and V-shaped press-in zones of the press-in pins of the upper and lower shielding plates always lying at the same side; placing the press-in pins of the upper shielding plate free of force into holes to be through-connected in the printed circuit board; and pressing the V-shaped press-in pins of the lower shielding plate into the already occupied holes of the printed circuit board to produce a firm contacting between the respective press-in pins and the printed circuit board.

2. A method for contacting at least on upper shielding plate on an upper side of a printed circuit board to at least one lower shielding plate on a lower side of the printed circuit board, the printed circuit board having a plurality of holes extending from the upper side to the lower side, comprising the steps of:

providing a plurality of upper press-in pins on the upper shielding plate, each of the upper press-in pins having an arcuate press-in zone;

providing a plurality of lower press-in pins on the lower shielding plate, each of the lower press-in pins having a V-shaped press-in zone;

placing respectively the upper press-in pins of the upper shielding plate free of force into the plurality of holes of the printed circuit board;

pressing respectively the lower press-in pins of the lower shielding plate into the plurality of holes of the printed circuit board already occupied by the upper press-in pins of the upper shielding plate to produce a firm contacting between the upper and lower press-in pins and the printed circuit board, the lower press-in pins being oriented relative to the upper press-in pins such that respective apexes of the arcuate press-in zones and of the V-shaped press-in zones are adjacent one another.

3. A method for establishing a connection between a printed circuit board and at least one upper shielding plate on an upper side of the printed circuit board and at least one lower shielding plate on a lower side of the printed circuit board, the printed circuit board having a plurality of holes extending from the upper side to the lower side, each of the holes having a wall, comprising the steps of:

providing a plurality of upper press-in pins on the upper shielding plate, each of the upper press-in pins having an arcuate press-in zone;

providing a plurality of lower press-in pins on the lower shielding plate, each of the lower press-in pins having a V-shaped press-in zone;

placing respectively the upper press-in pins of the upper shielding plate face of force into the plurality of holes of the printed circuit board;

pressing respectively the lower press-in pins of the lower shielding plate into the plurality of holes of the printed circuit board already occupied by the upper press-in pins of the upper shielding plate to produce a firm contacting between the upper and lower press-in pins and the wall of the respective hole of the printed circuit board, the lower press-in pins being oriented relative to the upper press-in pins such that respective apexes of the arcuate press-in zones and of the V-shaped press-in zones are adjacent one another.

* * * * *